United States Patent
Arai et al.

(10) Patent No.: US 9,466,734 B2
(45) Date of Patent: Oct. 11, 2016

(54) METHOD OF MANUFACTURING SEMICONDUCTOR DEVICE AND SEMICONDUCTOR DEVICE

(71) Applicant: RENESAS ELECTRONICS CORPORATION, Kanagawa (JP)

(72) Inventors: Koichi Arai, Kanagawa (JP); Yasuaki Kagotoshi, Kanagawa (JP); Kenichi Hisada, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 55 days.

(21) Appl. No.: 14/325,614

(22) Filed: Jul. 8, 2014

(65) Prior Publication Data

US 2015/0035015 A1 Feb. 5, 2015

(30) Foreign Application Priority Data

Jul. 30, 2013 (JP) ................... 2013-157692

(51) Int. Cl.
| | |
|---|---|
| H01L 29/66 | (2006.01) |
| H01L 29/732 | (2006.01) |
| H01L 29/808 | (2006.01) |
| H01L 29/06 | (2006.01) |
| H01L 29/10 | (2006.01) |
| H01L 29/16 | (2006.01) |

(52) U.S. Cl.
CPC ....... H01L 29/8083 (2013.01); H01L 29/0692 (2013.01); H01L 29/1066 (2013.01); H01L 29/66068 (2013.01); *H01L 29/1608* (2013.01)

(58) Field of Classification Search
None
See application file for complete search history.

(56) References Cited

U.S. PATENT DOCUMENTS

| | | | |
|---|---|---|---|
| 8,436,397 B2 | 5/2013 | Shimizu et al. | |
| 2010/0148186 A1 | 6/2010 | Sheridan et al. | |
| 2012/0028376 A1* | 2/2012 | Radwan et al. | ................... 438/5 |
| 2012/0049202 A1* | 3/2012 | Nakano | ........................... 257/77 |

FOREIGN PATENT DOCUMENTS

| | | |
|---|---|---|
| JP | 2003-209263 A | 7/2003 |
| JP | 2010-147405 A | 7/2010 |

* cited by examiner

*Primary Examiner* — Calvin Choi
*Assistant Examiner* — Xiaoming Liu
(74) *Attorney, Agent, or Firm* — Mattingly & Malur, PC

(57) ABSTRACT

To provide a semiconductor device having a vertical JFET excellent in off-state performance without reducing a production yield. A gate region quadrangular in the cross-section along a channel width direction is formed below a source region by impurity ion implantation. By first etching, the source region over the upper surface of the gate region is removed to separate therebetween. Then, the upper surface of the gate region is processed by second etching having an etching rate lower at the side surface than at the center of the gate region. The resulting gate region has a lower surface parallel to the substrate surface and an upper surface below a boundary between the source region and the channel formation region and having, in the cross-section along the channel width direction, a downward slope from the side surface to the center. As a result, a channel length with reduced variations can be obtained.

20 Claims, 14 Drawing Sheets

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2013-157692 filed on Jul. 30, 2013 including the specification, drawings, and abstract is incorporated herein by reference in its entirety.

BACKGROUND

The present invention relates to a method of manufacturing a semiconductor device and a semiconductor device, for example, those suited for use in a semiconductor device having a vertical junction field effect transistor (JFET).

For example, U.S. Patent No. 20100148186 (Patent Document 1) describes a vertical JFET having a region equipped with sloped sidewalls which taper inward. These sidewalls form an angle of 5° or more from a vertical plane to the surface of a substrate. Since sidewall doping can be conducted without angled ion implantation, a vertical JFET having a uniformly and sufficiently controlled channel width can be formed according to this document.

Japanese Patent Laid-Open No. 2003-209263 (Patent Document 2) describes the structure of a vertical JFET having $n^+$ type drain semiconductor portions and $p^+$ type drain semiconductor portions and a method of manufacturing it. A channel semiconductor portion is located between the $p^+$ type gate semiconductor portions and is controlled by the $p^+$ type gate semiconductor portions.

Japanese Patent Laid-Open No. 2010-147405 (Patent Document 3) describes a normally off JFET capable of having improved breakdown voltage and reduced on resistance by introducing an impurity into the vicinity of a pn junction between a gate region and a channel region.

[Patent Documents]
[Patent Document 1] U.S. Patent No. 20100148186
[Patent Document 2] Japanese Patent Laid-Open No. 2003-209263
[Patent Document 3] Japanese Patent Laid-Open No. 2010-147405

SUMMARY

A vertical JFET can have improved off-state performance by increasing the channel length thereof.

For example, Patent Document 1 discloses a method of manufacturing a vertical JFET by forming a trench having a sloped sidewall in a substrate and introducing an impurity into the sidewall by ion implantation to have a gate region in the sidewall of the trench. By using this method, the channel length can be increased so that the vertical JFET thus obtained has improved off-state performance. It has however the problem that a production yield is not stable because the angle of the sloped sidewall cannot be controlled easily and the channel width varies in accordance with variations in the angle of the sloped sidewall.

Another problem and novel features will be apparent from the description herein and accompanying drawings.

According to one embodiment, a gate region having a quadrangular shape at the cross-section taken along a channel width direction is formed below a source region by impurity ion implantation. Then, first etching is performed to remove the source region located on the upper surface of the gate region to separate the source region from the gate region. Second etching having an etching rate lower at the side surface of the gate region than at the center of the gate region is then performed to process the upper surface of the gate region. As a result, the gate region thus obtained has a lower surface formed parallel to the surface of the substrate and an upper surface located below a boundary between the source region and a channel formation region and having a slope which lowers, at the cross-section taken along the channel width direction, from the side surface to the center.

According to the one embodiment, a semiconductor device having a vertical JFET and excellent in off-state performance can be manufactured without reducing a production yield.

DETAILED DESCRIPTION

Figure 1:
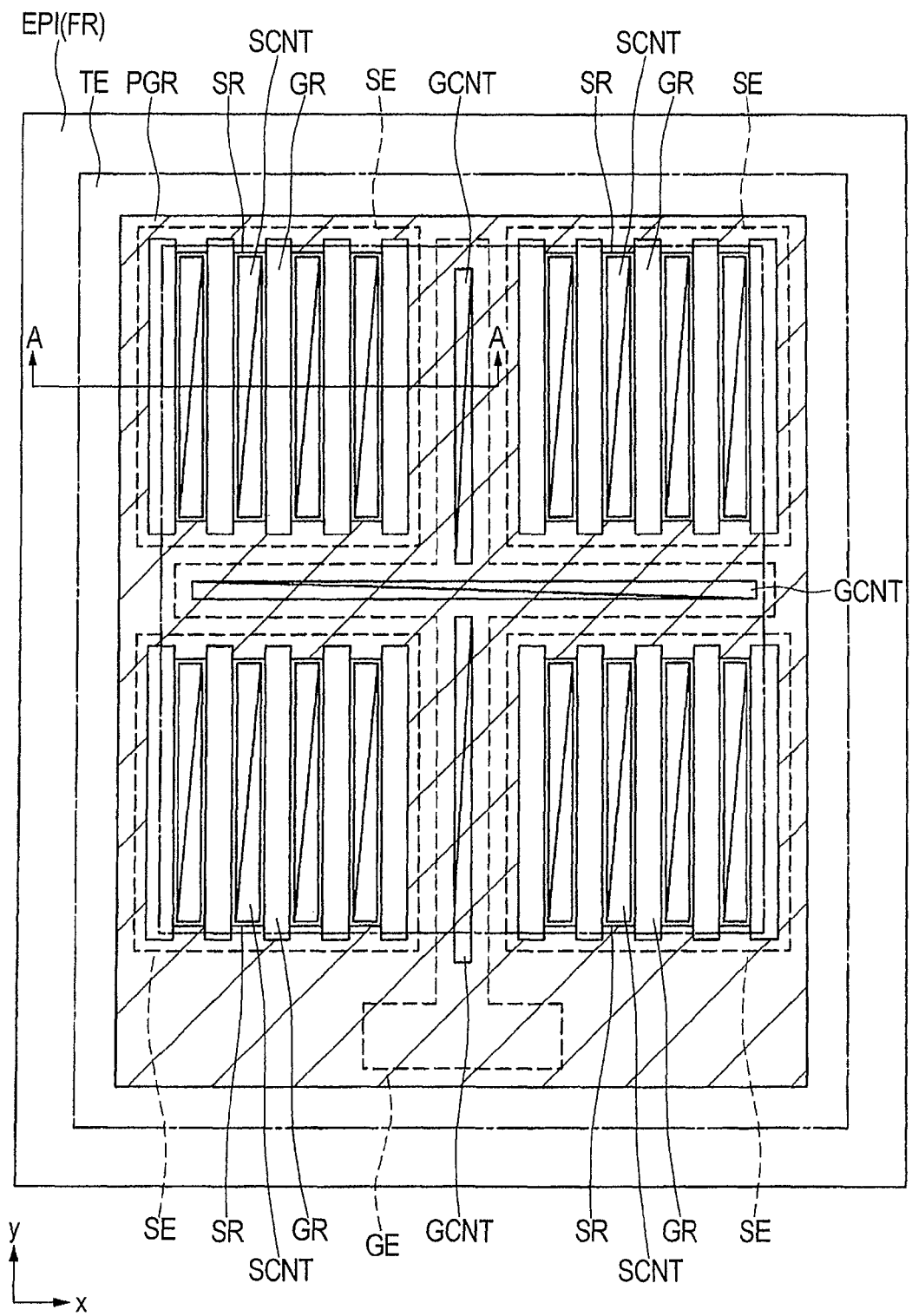
FIG. 1 is a fragmentary plan view showing one example of a planar layout configuration (from an epitaxial layer to a first layer metal film (a source electrode and a gate electrode)) of a semiconductor device according to First Embodiment.

In the below-described embodiments, when a reference is made to the number or the like (including the number, value, amount, range, or the like) of components, the number is not limited to a specific number but may be more or less than the specific number, unless otherwise specifically indicated or principally apparent that the number is limited to the specific number.

Further, in the below-described embodiments, it is needless to say that constituent components (including constituent steps or the like) are not always essential unless otherwise specifically indicated or principally apparent that they are essential.

It is needless to say that the term "is made of A", "is comprised of A", "has A", or "contains A" does not exclude another component unless otherwise specifically indicated that it is made of, is comprised of, has, or contains only the component. Similarly, in the following embodiments, when a reference is made to the shape, positional relationship, or the like of the constituent components, that substantially approximate or similar to it is also embraced unless otherwise specifically indicated or principally apparent that it is not. This also applies to the above-described value and range.

In the drawings to be used in the following embodiments, even a plan view is hatched to facilitate understanding of it. In all the drawings for describing the embodiments, members of a like function will be identified by like reference numerals and overlapping descriptions will be omitted. Embodiments will hereinafter be described in detail referring to drawings.

(First Embodiment)

A semiconductor device having a vertical JFET according to First Embodiment will hereinafter be described referring to FIGS. 1 to 3. As a material of a substrate used in First Embodiment, for example, silicon carbide (SiC) having a band gap wider than that of a simple silicon substance is used.

FIG. 1 is a fragmentary plan view showing one example of a planar layout configuration (from an epitaxial layer to a first layer metal film (a source electrode and a gate electrode)) of the semiconductor device according to First Embodiment. FIG. 2 is a fragmentary plan view showing one example of a planar layout configuration (from a contact hole to a second layer metal film (a source pad and a gate pad)) of the semiconductor device according to First Embodiment. FIG. 3 is a fragmentary cross-sectional view (a fragmentary cross-sectional view taken along the line A-A shown in FIGS. 1 and 2) showing one example of the configuration of the semiconductor device according to First Embodiment.

Figure 3:
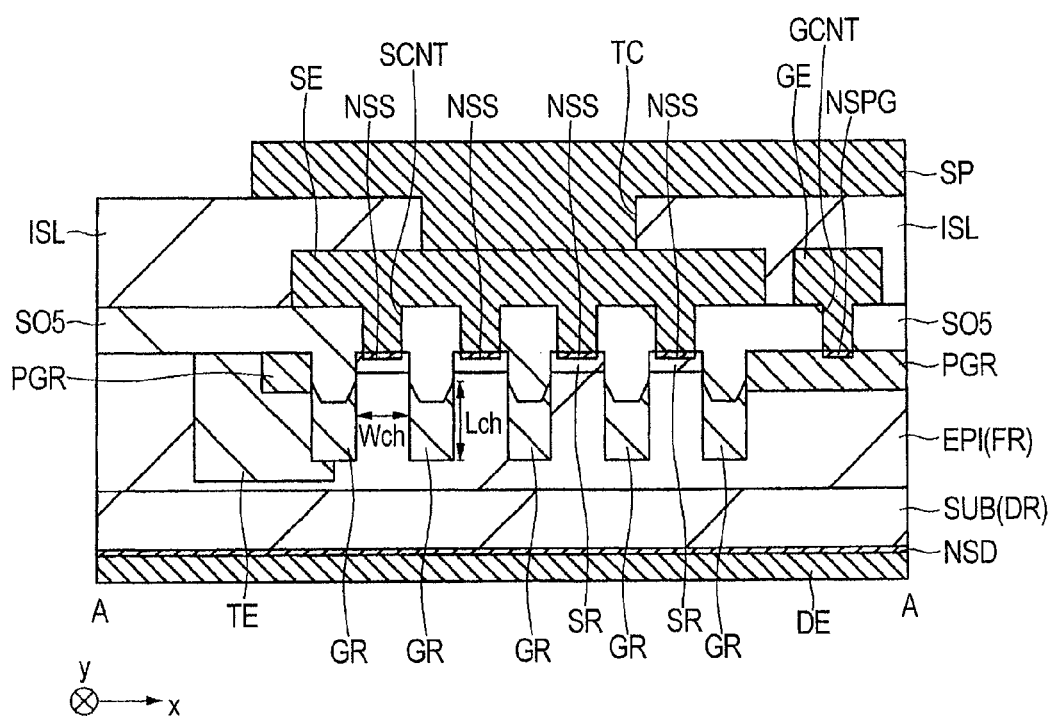
FIG. 3 is a fragmentary cross-sectional view (a fragmentary cross-sectional view taken along the line A-A shown in FIGS. 1 and 2) showing one example of the configuration of the semiconductor device according to First Embodiment.

As shown in FIGS. 1 and 3, a substrate SUB which will be a drain region DR has, on the surface thereof, an epitaxial layer EPI which will be a drift region FR. The substrate SUB and the epitaxial layer EPI are each made of silicon carbide (SiC) having an n type impurity introduced therein. The concentration of the n type impurity introduced into the epitaxial layer EPI is lower than the concentration of the n type impurity introduced into the substrate SUB. The epitaxial layer EPI has a thickness of, for example, from 5 to 10 µm.

The epitaxial layer EPI has therein a plurality of gate regions GR extending from the upper surface thereof to the inside thereof while being separated from one another in a direction x (in a first direction or in a channel width direction). These gate regions GR are each made of a semiconductor region obtained by introducing a p type impurity into the epitaxial layer EPI. The gate regions GR extend in a direction y (second direction) orthogonal to the direction x and a portion of the epitaxial layer EPI sandwiched between two gate regions GR adjacent to each other functions as a channel formation region. This means that the distance between these two adjacent gate regions GR is a channel width Wch and the depth (distance from the upper surface to the lower surface) of the gate region GR at the side surface thereof is a channel length Lch. The channel width Wch is, for example, 1 µm and the channel length Lch is, for example, 1.5 µm.

A gate extraction region PGR (a hatched region in FIG. 1) surrounds the outer periphery of each active region having therein the plurality of gate regions GR. The gate extraction region PGR is made of a semiconductor region obtained by introducing a p type impurity into the epitaxial layer EPI and it is electrically coupled to the plurality of gate regions GR. The concentration of the p type impurity doped into the gate extraction region PGR is higher than the concentration of the p type impurity introduced into the plurality of gate regions GR.

This gate extraction region PGR has thereon a gate electrode GE with a silicon oxide film SO5 therebetween. The gate electrode GE is electrically coupled to the gate extraction region PGR through a gate contact hole GCNT formed in the silicon oxide film SO5 and the gate electrode GE and the gate extraction region PGR have therebetween a silicide layer. The gate electrode GE is made of, for example, a stacked film obtained by successively depositing a titanium (Ti) film, a titanium nitride (TiN) film, and an aluminum (Al) film in order of mention. The silicide layer is made of, for example, a nickel silicide (NiSi) layer NSPG. The silicide layer thus provided is useful for reducing the contact resistance between the gate extraction region PGR and the gate electrode GE and thereby reducing the resistance of a gate wiring.

A termination region TE is provided so as to surround the outer periphery of all the active regions. This termination region TE is a region provided in order to relax an electric field intensity at the outer periphery of the semiconductor device. The termination region TE is made of a semiconductor region obtained by introducing a p type impurity into the epitaxial layer EPI and is electrically coupled to the plurality of gate regions GR and the gate extraction region PGR. The concentration of the p type impurity introduced into the termination region TE is lower than the concentration of the p type impurity introduced into the plurality of gate regions GR.

The epitaxial layer EPI sandwiched between two adjacent gate regions GR has, in the upper surface region thereof, a source region SR. The source region SR is made of a semiconductor region obtained by introducing an n type impurity into the epitaxial layer EPI. The concentration of the n type impurity introduced into the source region SR is higher than the concentration of the n type impurity introduced into the epitaxial layer EPI.

This source region SR has thereon a source electrode SE while having the silicon oxide film SO5 therebetween. The source electrode SE is electrically coupled to the source region SR through a source contact hole SCNT formed in the silicon oxide film SO5, and the source electrode SE and the source region SR have therebetween a silicide layer. The source electrode SE is made of, for example, a stacked film obtained by successively depositing a titanium (Ti) film, a titanium nitride (TiN) film, and an aluminum (Al) film in order of mention. The silicide layer is made of, for example, a nickel silicide (NiSi) layer NSS and the silicide layer thus provided is useful for reducing the contact resistance between the source region SR and the source electrode SE and thereby reducing the resistance of a source wiring.

The substrate SUB, which will be a drain region DR, has on the back surface thereof a drain electrode DE while having a silicide layer therebetween. The drain electrode DE is made of, for example, a stacked film obtained by successively depositing a titanium (Ti) film, a titanium nitride (TiN) film, and an aluminum (Al) film in order of mention. The silicide layer is made of, for example, a nickel silicide (NiSi) layer NSD and the silicide layer thus provided is useful for reducing the contact resistance between the substrate SUB and the drain electrode DE and thereby reducing the resistance of a drain wiring.

Figure 2:
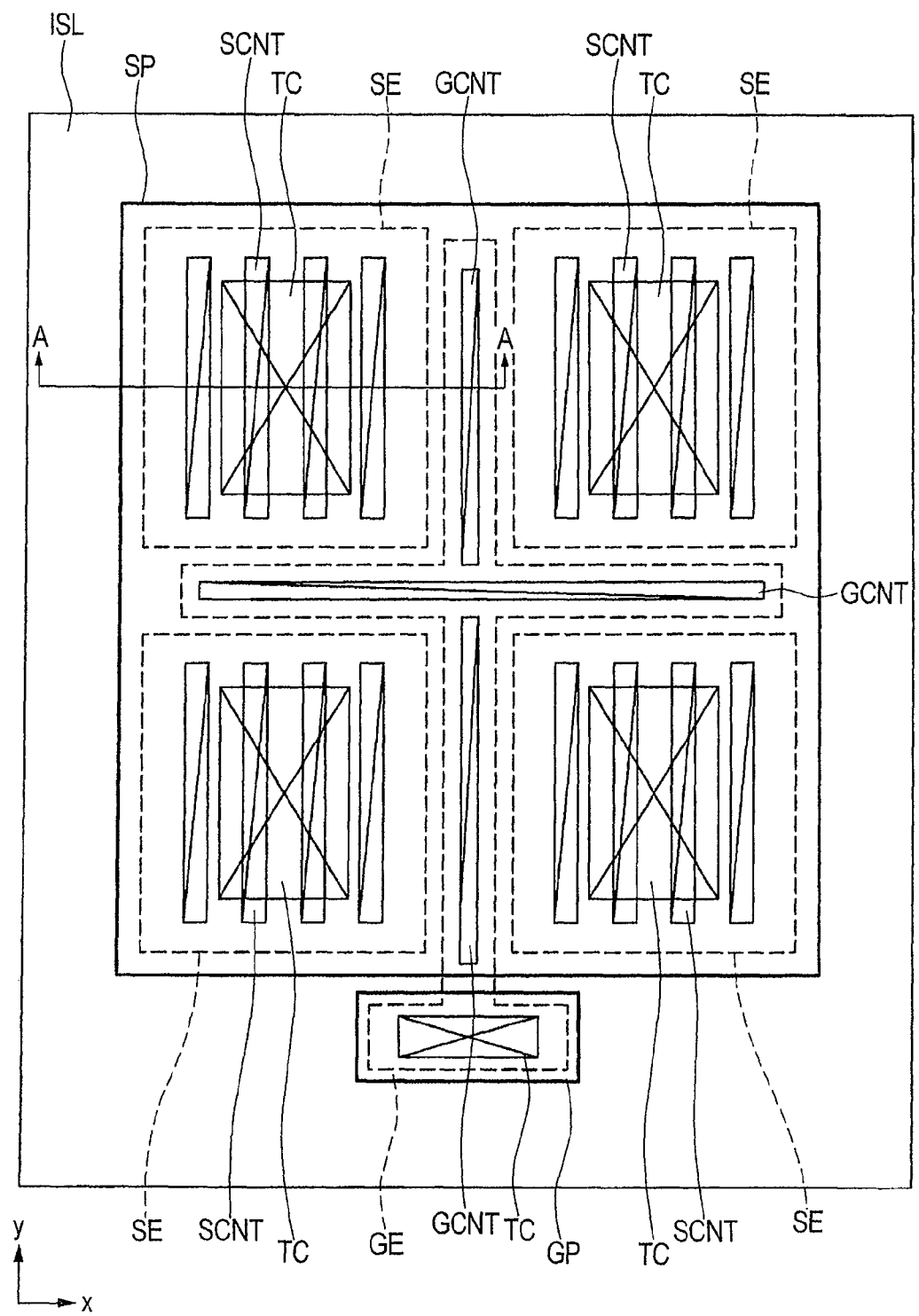
FIG. 2 is a fragmentary plan view showing one example of a planar layout configuration (from a contact hole to a second layer metal film (a source pad and a gate pad)) of the semiconductor device according to First Embodiment.

Further, as shown in FIGS. 2 and 3, the source electrode SE and the gate electrode GE are covered with an interlayer insulating film ISL. This interlayer insulating film ISL has thereon a source pad SP and a gate pad GP. Through a through-hole TC formed in the interlayer insulating film ISL, the source pad SP is electrically coupled to the source electrode SE and the gate pad GP is electrically coupled to the gate electrode GE. As a result, the semiconductor device having a vertical JFET has the source pad SP and the gate pad GP on the surface side of the substrate SUB and has the drain electrode DE on the back surface side of the substrate SUB. By applying an electric signal to these terminals from the outside, a plurality of vertical JFETs can be operated.

The device according to First Embodiment is characterized by the cross-sectional shape of the gate region GR extending along the channel width direction of the vertical JFET.

Described specifically, as shown in FIG. 3, the side surface (a pn junction portion which is a boundary between the channel formation region and the gate region GR) of the gate region GR is perpendicular to the surface of the substrate SUB. The lower surface (surface on the side closer to the surface of the substrate SUB) of the gate region GR is flat and is parallel to the surface of the substrate SUB.

On the other hand, the upper surface (surface on the side more distant from the surface of the substrate SUB, surface on the side opposite to the lower surface) of the gate region GR is located below the boundary between the source region SR and the channel formation region and is not parallel to the surface of the substrate SUB. In the cross-section taken along the channel width direction, the upper surface of the gate region has a downward slope from the side surface to the center.

Described specifically, the upper surface of the gate region GR is flat at the center portion thereof and is parallel to the surface of the substrate SUB. With regard to the upper surface of the gate region GR from the center portion to both the side surfaces, on the other hand, it has a slope toward both the side surfaces and gradually separates from the surface of the substrate SUB. The gate region GR is formed so that in the cross-section taken along the channel width direction, the distance of the side surface of the gate region GR from the lower surface to the upper surface is longer than the distance of the center portion of the gate region GR from the lower surface to the upper surface.

Next, the advantage of the cross-sectional shape of the gate region GR of First Embodiment will be described.

Figure 4A:
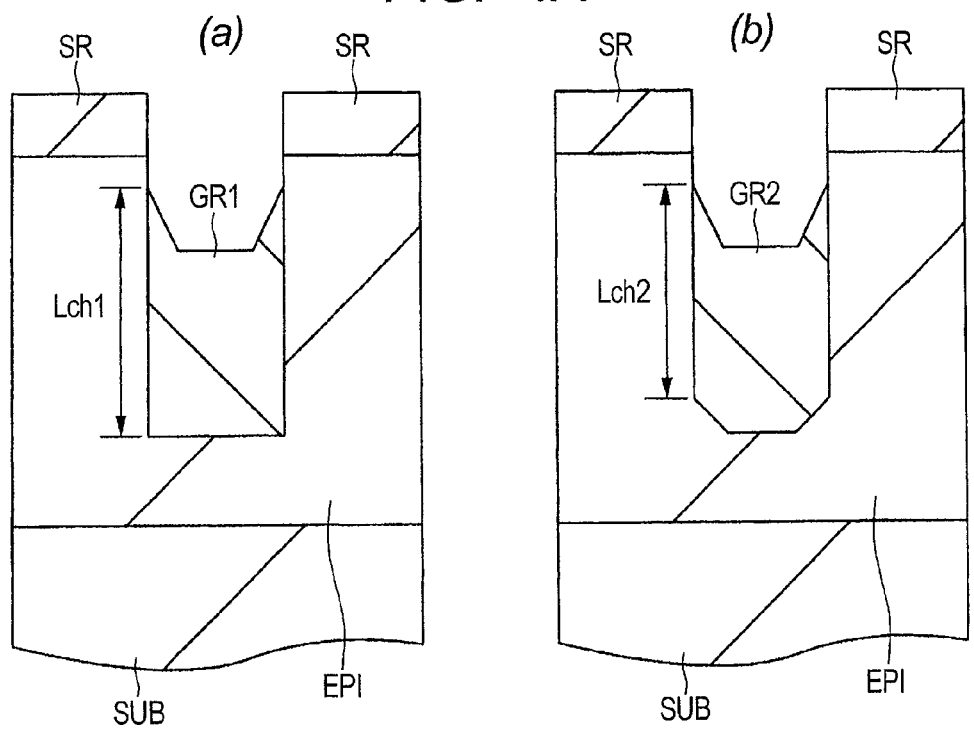
FIG. 4A(a) is an enlarged cross-sectional view of a gate region in First Embodiment and FIG. 4A(b) is an enlarged cross-sectional view of a gate region in Comparative Example.

(1) The advantage of making the lower surface of the gate region GR parallel to the surface of the substrate SUB will next be described referring to FIGS. 4A(a) and 4A(b). FIG. 4A(a) is an enlarged cross-sectional view of the gate region in First Embodiment and FIG. 4A(b) is an enlarged cross-sectional view of a gate region in Comparative Example.

In First Embodiment, as shown in FIG. 4A(a), the lower surface of a gate region GR1 is parallel to the surface of the substrate SUB. In Comparative Example, on the other hand, as shown in FIG. 4A(b), the lower surface of a gate region GR2 at the center portion thereof is parallel to the surface of the substrate SUB. With regard to the lower surface of the gate region GR2 from the center portion to both the side surfaces, however, it has a slope toward both the side surfaces and gradually separates from the surface of the substrate SUB.

This means that the distance between the upper surface and the lower surface at the center portion of the gate region GR1 of First Embodiment is equal to the distance between the upper surface and the lower surface at the center portion of the gate region GR2 of Comparative Example. However, the distance between the upper surface and the lower surface at the side surface of the gate region GR1 of First Embodiment is longer than the distance between the upper surface and the lower surface at the side surface of the gate region GR2 of Comparative Example.

The channel length of a vertical JFET is determined by the length of a pn junction portion which is a boundary between a channel formation region and a gate region, that is, a distance between the upper surface and the lower surface of a gate region at the side surface thereof. Therefore, a channel length Lch1 of the vertical JFET having the gate region GR1 of First Embodiment is longer than a channel length Lch2 of the vertical JFET having the gate region GR2 of Comparative Example (Lch1>Lch2). As a result, the vertical JFET of First Embodiment having the gate region GR1 having a flat lower surface has more improved off-state performance than the vertical JFET of Comparative Example having the gate region GR2 having a sloped lower surface.

(2) The advantage of the upper surface of the gate region GR located below the boundary between the source region SR and the channel formation region and having a downward slope from the side surface of the gate region GR toward the center thereof will next be described referring to FIG. 3.

When the source region SR and the gate region GR come in contact with each other, a current flows between the source region SR and the gate region GR and the vertical JFET thus obtained has deteriorated reliability. It is therefore necessary to completely separate the source region SR from the gate region GR. In First Embodiment, as shown in the above-mentioned FIG. 3, in order to achieve complete separation between the source region SR and the gate region GR, the source region SR and the gate region GR are separated from each other by removing the epitaxial layer EPI and the source region SR located on the upper surface of the gate region GR by dry etching.

Different from First Embodiment, when the gate region GR is separated from the source region SR without forming a downward slope from the side surface of the gate region GR to the center thereof, the upper surface of the gate region GR is etched to be flat until the gate region GR is completely separated from the source region SR. Variations in the depth of etching during this etching, if any, may lead to variations in the distance between the upper surface and the lower surface at the side surface of the gate region GR, that is, variations in the channel length of the vertical JFET.

In First Embodiment in which the gate region GR is separated from the source region SR by forming a downward slope from the side surface of the gate region GR to the center thereof, on the other hand, the source region on the upper surface of the gate region GR is etched flatly to the depth that enables separation between the source region SR and the gate region GR (first etching). Then, the upper surface of the gate region GR is etched further to completely separate between the source region SR and the gate region GR (second etching).

This second etching is conducted under such etching conditions as to make the etching rate of the upper surface at the side surface of the gate region GR smaller than the etching rate of the upper surface at the center of the gate region GR. This makes it possible to decrease the variations in etching depth at the side surface of the gate region GR even if there occur variations in the etching depth in the gate region GR. As a result, a vertical JFET having less variations in the channel depth can be obtained.

A detailed description of the processing for separation between the source region SR and the gate region GR by dry etching will be made later during the description of a manufacturing method of a semiconductor device having a vertical JFET.

Figure 4B:
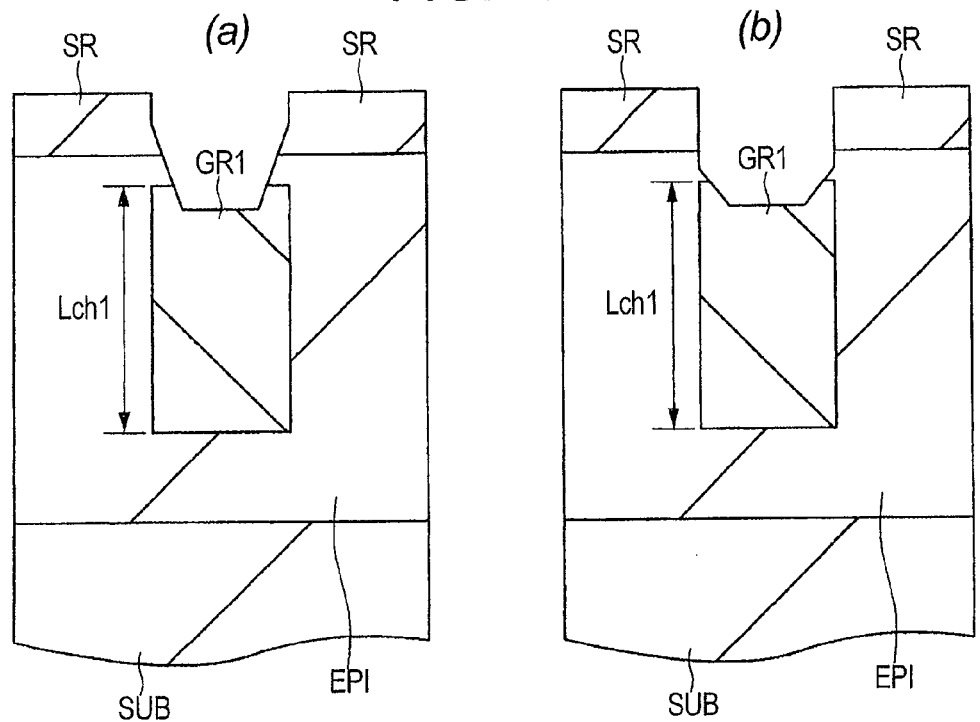
FIG. 4B(a) is an enlarged cross-sectional view of a first modification example of a slope of the upper surface of the gate region in First Embodiment and FIG. 4B(b) is an enlarged cross-sectional view of a second modification example of a slope of the upper surface of the gate region in First Embodiment.

In FIG. 4A(a), the slope starts from the upper surface of the gate region GR1. The starting position of the slope is not limited to it. The slope may start from, for example, a position within the source region SR as shown in FIG. 4B(a) or it may start from, for example, from the epitaxial layer EPI located between the source region SR and the gate region GR1 as shown in FIG. 4B(b). Such configurations may be employed insofar they can separate between the source region SR and the gate region GR1. In such cases, an advantage similar to that of FIG. 4A(a) can be obtained.

The gate region GR shown in the above-mentioned FIG. 3 has, in the cross-section taken along the channel width direction, a flat portion and a sloped portion. The gate region is not limited to it. For example, as shown in FIG. 5(a), the upper surface of the gate region GR may be V-shaped in the cross-section taken along the channel width direction; or for example, as shown in FIG. 5(b), the upper surface of the gate region GR may be U-shaped in the cross-section taken along the channel width direction.

Next, a manufacturing method of the semiconductor device having a vertical JFET according to First Embodiment will be described in order of steps while referring to FIGS. 6 to 17. FIGS. 6 to 17 are fragmentary cross-sectional views of the semiconductor device according to First Embodiment.

Figure 6:
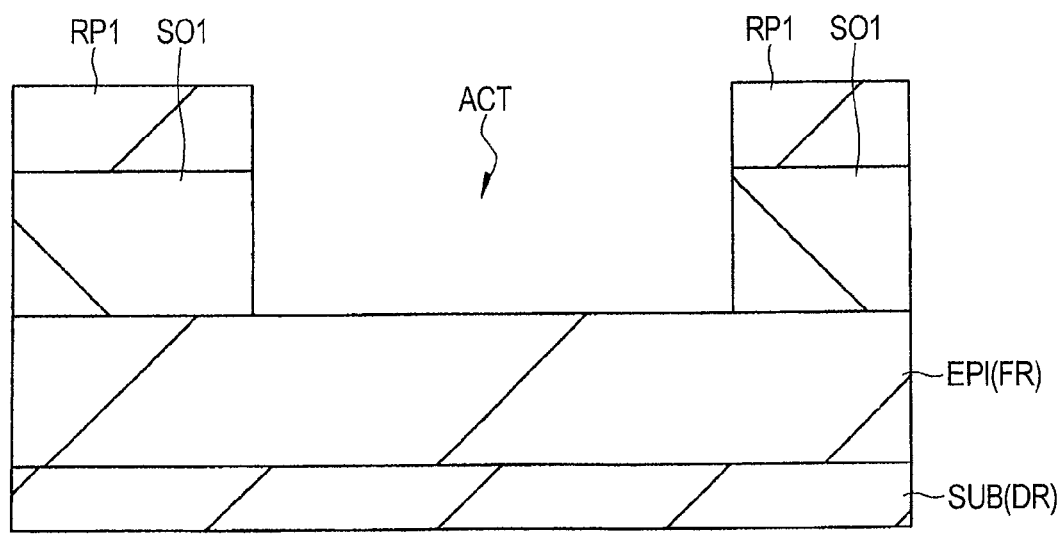
FIG. 6 is a fragmentary cross-sectional view showing a manufacturing step of the semiconductor device according to First Embodiment.

First, as shown in FIG. 6, a substrate SUB made of silicon carbide (SiC) is provided as a substrate using a material having a band gap wider than that of a simple silicon substance. The substrate SUB can be used as a drain region DR and it has a specific resistance of, for example, about 20 mΩ·cm. Then, an epitaxial layer EPI made of silicon carbide (SiC) is formed on the surface of the substrate SUB by epitaxial growth. The epitaxial layer EPI can be used as a drift region FR. The epitaxial layer EPI has a thickness of, for example, from 5 to 10 μm and has an impurity concentration of, for example, from $1 \times 10^{16}$ cm$^{-3}$ to $2 \times 10^{16}$ cm$^{-3}$.

Next, a silicon oxide film SO1 is formed on the upper surface of the epitaxial layer EPI. The silicon oxide film SO1 is, for example, a TEOS (tetraethyl orthosilicate) film and it has a thickness of, for example, 2 μm. Then, a resist pattern PR1 is formed using lithography. By dry etching with this resist pattern PR1 as a mask, the silicon oxide film SO1 is removed from an active region ACT in which a plurality of vertical JFETS are to be formed.

Figure 7:
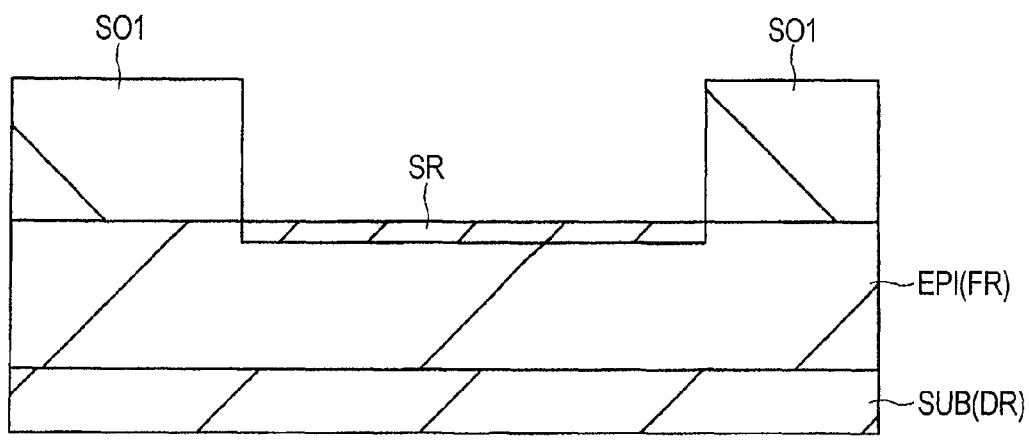
FIG. 7 is a fragmentary cross-sectional view showing a manufacturing step of the semiconductor device following that of FIG. 6.

Next, as shown in FIG. 7, after removal of the resist pattern RP1, an n type impurity is introduced into the epitaxial layer EP1 by ion implantation with the silicon oxide film SO1 as a mask to form a source region SR. The depth of the source region SR from the upper surface of the epitaxial layer EPI is, for example, 0.2 μm.

The n type impurity is, for example, nitrogen (N). By performing ion implantation a plurality of times, a source region SR having a desired concentration profile can be formed. For example, when ion implantation is performed twice, first ion implantation is conducted under the conditions of a dose of 3E14 cm$^{-2}$ and an energy of 50 keV and second ion implantation is conducted under the conditions of a dose of 2E14 cm$^{-2}$ and an energy of 100 keV.

Figure 8:
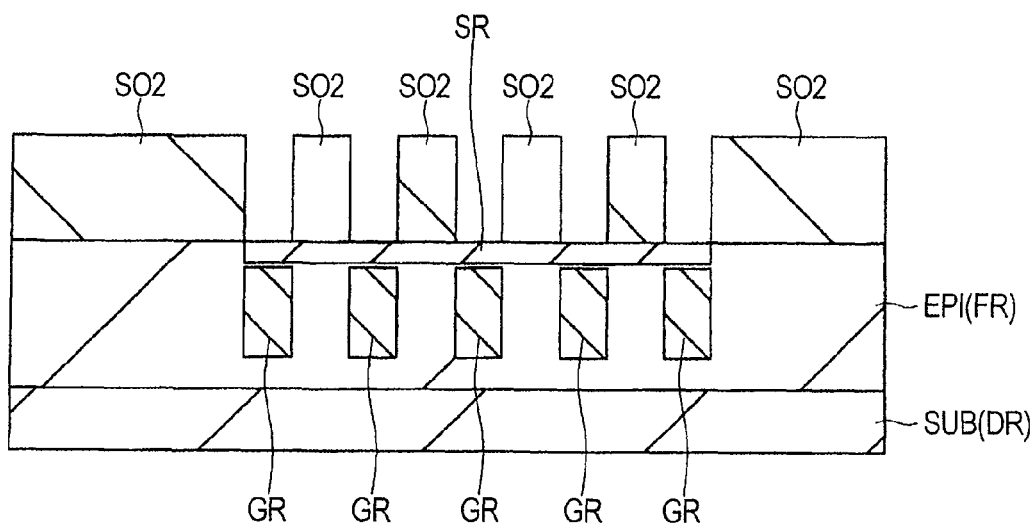
FIG. 8 is a fragmentary cross-sectional view showing a manufacturing step of the semiconductor device following that of FIG. 7.

Next, as shown in FIG. 8, after removal of the silicon oxide film SO1 by wet etching, a silicon oxide film SO2 is formed on the upper surface of the epitaxial layer EPI. The silicon oxide film SO2 is, for example, a TEOS film and it has a thickness of, for example, 1.5 μm. Then, by dry etching with a resist pattern (not illustrated) formed by lithography as a mask, the silicon oxide film SO2 is removed from a region in which a gate region is to be formed.

Next, after removal of the resist pattern, by ion implantation with the silicon oxide film SO2 as a mask, a p type impurity is introduced into the epitaxial layer EP1 to form two or more gate regions GR separated from each other along the channel width direction. During this ion implantation, the p type impurity is implanted so that the gate region GR has a quadrangular cross-section taken along the channel width direction and at the same time, the gate region GR has a uniform impurity concentration in the depth direction of the epitaxial layer EPI. The gate region GR is formed in the epitaxial layer EPI below the source region SR with a predetermined distance from the lower surface of the source region SR. The distance from the upper surface of the epitaxial layer EPI to the lower surface of the gate region GR is, for example, 1 µm.

The p type impurity is, for example, aluminum (Al). By performing ion implantation a plurality of times, the gate region GR having a quadrangular cross-section taken along the channel width direction and having a uniform impurity concentration in the depth direction of the epitaxial layer EPI can be formed. For example, when ion implantation is performed six times, examples of the ion implantation conditions are as follows: first ion implantation at a dose of $2E14$ cm$^{-2}$ and an energy of 50 keV, second ion implantation at a dose of $2E14$ cm$^{-2}$ and an energy of 75 keV, third ion implantation at a dose of $2E14$ cm$^{-2}$ and an energy of 250 keV, fourth ion implantation at a dose of $2E14$ cm$^{-2}$ and an energy of 350 keV, fifth ion implantation at $2E14$ cm$^2$ and an energy of 450 keV, and sixth ion implantation at a dose of $4E14$ cm$^{-2}$ and an energy of 750 keV.

Figure 9:
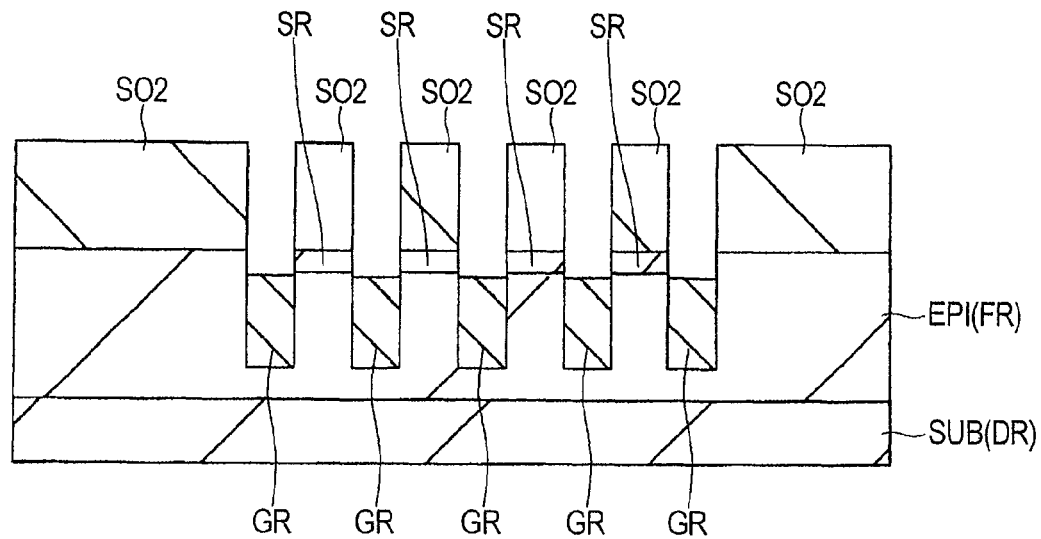
FIG. 9 is a fragmentary cross-sectional view showing a manufacturing step of the semiconductor device following that of FIG. 8.

Next, as shown in FIG. 9, with the silicon oxide film SO2 as a mask, the epitaxial layer EPI including the source region SR is etched by dry etching until exposure of the gate region GR. This etching of the epitaxial layer EPI is performed perpendicularly to the surface of the substrate SUB (which will hereinafter be called "perpendicular etching"). By this etching, the upper surface of the gate region GR becomes flat.

Figure 10:
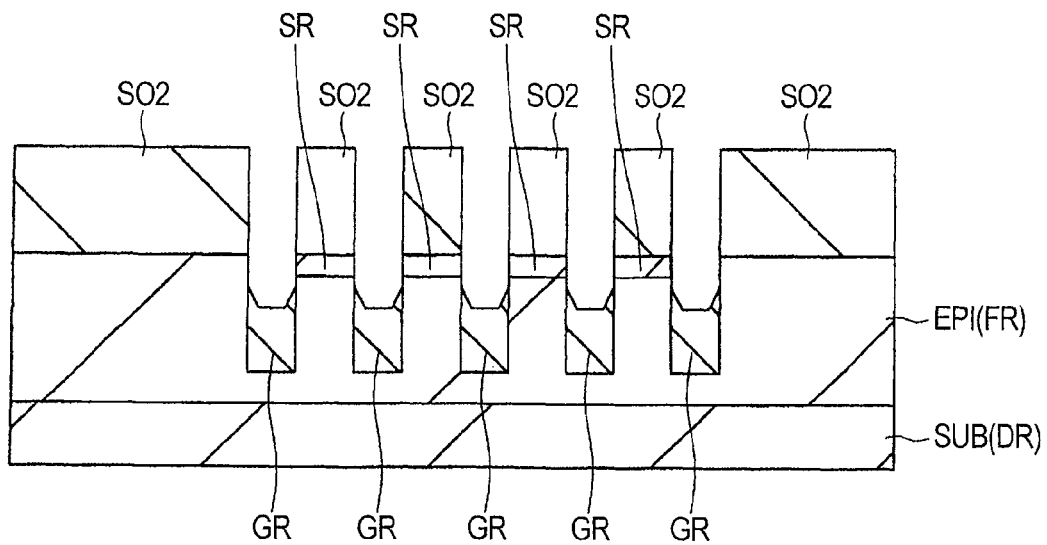
FIG. 10 is a fragmentary cross-sectional view showing a manufacturing step of the semiconductor device following that of FIG. 9.

Next, as shown in FIG. 10, by dry etching with the silicon oxide film SO2 as a mask, the upper surface of the gate region GR is etched to completely separate between the source region SR and the gate region GR. This etching is performed while setting the etching rate at the side surface of the gate region GR lower than the etching rate at the center of the gate region GR to allow the gate region GR to have a sloped upper surface (which will hereinafter be called "taper etching"). This makes it possible to reduce variations in the etching depth of the side surface of the gate region GR even if there occur variations in the etching depth of the gate region GR. As a result, a vertical JFET having less variations in channel length can be obtained.

In First Embodiment, the gate region GR is formed in advance by using ion implantation so that the gate region GR can be separated from the source region SR relatively easily. As shown above in FIGS. 4B(a) and 4B(b), when the gate region GR is obviously separated from the source region SR, the perpendicular etching described above referring to FIG. 9 may be stopped in the source region SR or may be stopped in the epitaxial layer EPI located between the source region SR and the gate region GR.

Comparison in the etching conditions between perpendicular etching and taper etching is listed in Table 1.

etching and high in taper etching. The lower electrode temperature is high in perpendicular etching and low in taper etching.

Figure 11:
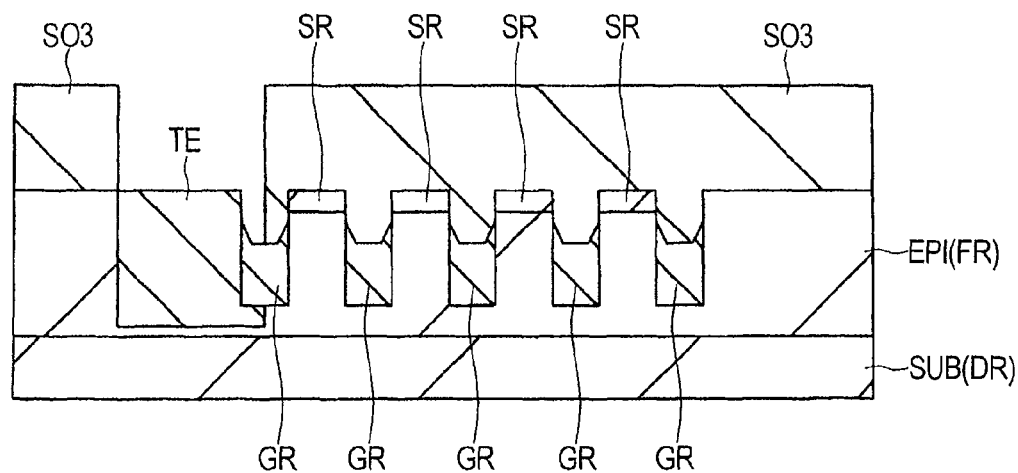
FIG. 11 is a fragmentary cross-sectional view showing a manufacturing step of the semiconductor device following that of FIG. 10.

Next, as shown in FIG. 11, after removal of the silicon oxide film SO2 by wet etching, a silicon oxide film SO3 is formed on the upper surface of the epitaxial layer EPI. The silicon oxide film SO3 is, for example, a TEOS film and it has a thickness of, for example, 1.5 µm. Then, by dry etching with a resist pattern (not illustrated) formed by lithography as a mask, the silicon oxide film SO3 is removed from a region in which a termination region is to formed.

Next, after removal of the resist pattern, by ion implantation with the silicon oxide film SO3 as a mask, a p type impurity is introduced into the epitaxial layer EPI to form the termination region TE. The termination region TE is a region formed so as to relax an electric field intensity at the outer periphery of the semiconductor device. It has a depth greater than that of the gate region GR and has an impurity concentration lower than that of the gate region GR.

The p type impurity is, for example, aluminum (Al). By performing ion implantation a plurality of times, a termination region TE having almost a uniform depth from the upper surface of the epitaxial layer EPI and having a uniform impurity concentration in the depth direction of the epitaxial layer EPI is formed. For example, when ion implantation is conducted six times, examples of the ion implantation conditions are as follows: first ion implantation at a dose of $2E12$ cm$^{-2}$ and an energy of 50 keV, second ion implantation at a dose of $2E12$ cm$^{-2}$ and an energy of 75 keV, third ion implantation at a dose of $2E12$ cm$^{-2}$ and an energy of 250 keV, fourth ion implantation at a dose of $2E12$ cm$^{-2}$ and an energy of 4000 keV, fifth ion implantation at a dose of $2E12$ cm$^{-2}$ and an energy of 550 keV, and sixth ion implantation at a dose of $4E12$ cm$^{-2}$ and an energy of 850 keV.

Figure 12:
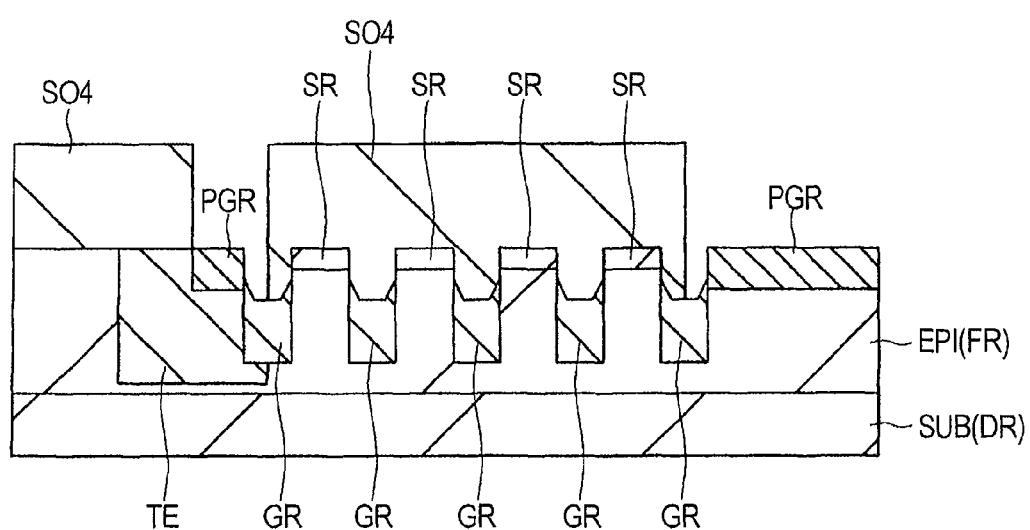
FIG. 12 is a fragmentary cross-sectional view showing a manufacturing step of the semiconductor device following that of FIG. 11.

Next, as shown in FIG. 12, after removal of the silicon oxide film SO3 by wet etching, a silicon oxide film SO4 is formed on the upper surface of the epitaxial layer EPI. The silicon oxide film SO4 is, for example, a TEOS film and has a thickness of, for example, 1.5 µm. Then, by dry etching with a resist pattern (not illustrated) formed by lithography as a mask, the silicon oxide film SO4 is removed from a region in which a gate extraction region is to be formed.

Next, after removal of the resist pattern, by ion implantation with the silicon oxide film SO4 as a mask, a p type impurity is introduced into the epitaxial layer EPI to form the gate extraction region PGR. The gate extraction region PGR is formed so as to be coupled with some of the gate regions GR and it has a concentration higher than the impurity concentration of the gate region GR.

The p type impurity is, for example, aluminum (Al). By performing ion implantation a plurality of times, a gate

TABLE 1

| | Etching gas ratio (etching gas/deposition gas) | RF power | Processing pressure | Lower electrode temperature |
| --- | --- | --- | --- | --- |
| Perpendicular etching | Large etching gas ratio | High power | Low pressure | High temperature |
| Taper etching | Small etching gas ratio | Low power | High pressure | Low temperature |

The gas ratio (etching gas/deposition gas) is large in perpendicular etching and small in taper etching. The RF power is high in perpendicular etching and low in taper etching. The processing pressure is low in perpendicular extraction region PGR having a desired concentration profile can be formed. For example, when ion implantation is performed three times, examples of the ion implantation conditions are as follows: first ion implantation at a dose of 1E15 cm$^{-2}$ and an energy of 50 keV, second ion implantation at a dose of 1E15 cm$^{-2}$ and an energy of 75 keV, and third ion implantation at a dose of 1E15 cm$^{-2}$ and an energy of 250 keV.

Next, after removal of the silicon oxide film SO4 by wet etching, a carbon (C) film is formed on the upper surface of the epitaxial layer EPI. Then, heat treatment at, for example, 1800° C. is conducted to activate the n type impurity and p type impurity introduced into the epitaxial layer EPI. By conducting the heat treatment with the carbon (C) film as a mask, outflow of silicon (Si) from the epitaxial layer EPI can be prevented.

Figure 13:
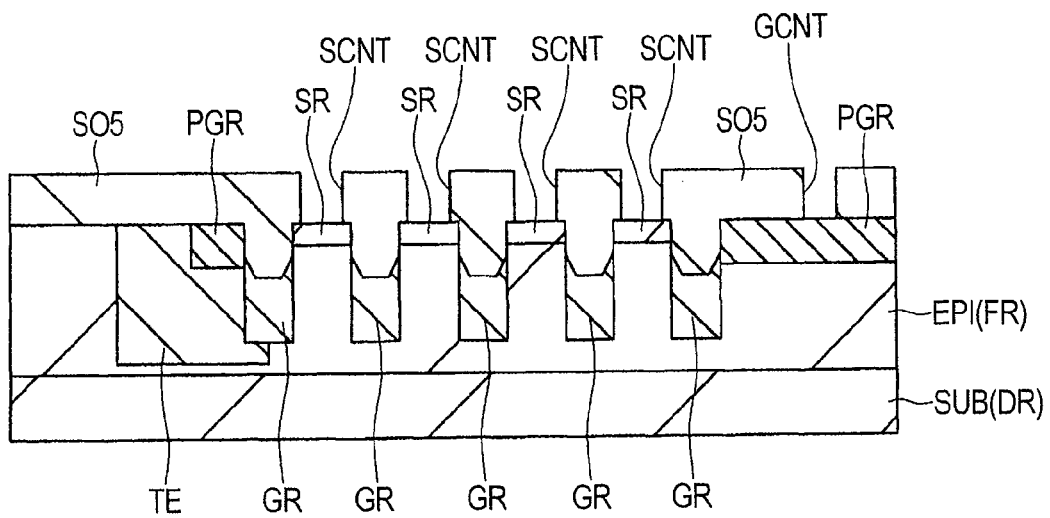
FIG. 13 is a fragmentary cross-sectional view showing a manufacturing step of the semiconductor device following that of FIG. 12.

Next, as shown in FIG. 13, after removal of the carbon (C) film by plasma ashing, a silicon oxide film SO5 is formed on the upper surface of the epitaxial layer EPI. The silicon oxide film SO5 is, for example, a TEOS film and it has a thickness of, for example, about 1 μm. Then, by dry etching with a resist pattern (not illustrated) formed by lithography as a mask, the silicon oxide film SO5 is processed into a source contact hole SCNT from which the upper surface of the source region SR (a portion to which a source electrode made of a first layer metal film is contiguous) is exposed and a gate contact hole GCNT from which a portion of the upper surface of the gate extraction region PGR (a portion to which a gate electrode made of a first layer metal film is contiguous) is exposed.

Next, after removal of the resist pattern, a nickel (Ni) film is formed by sputtering on the upper surface of the silicon oxide film SO5 including the inner wall (bottom surface and side surface) of the source contact hole SCNT and the gate contact hole GCNT.

Figure 14:
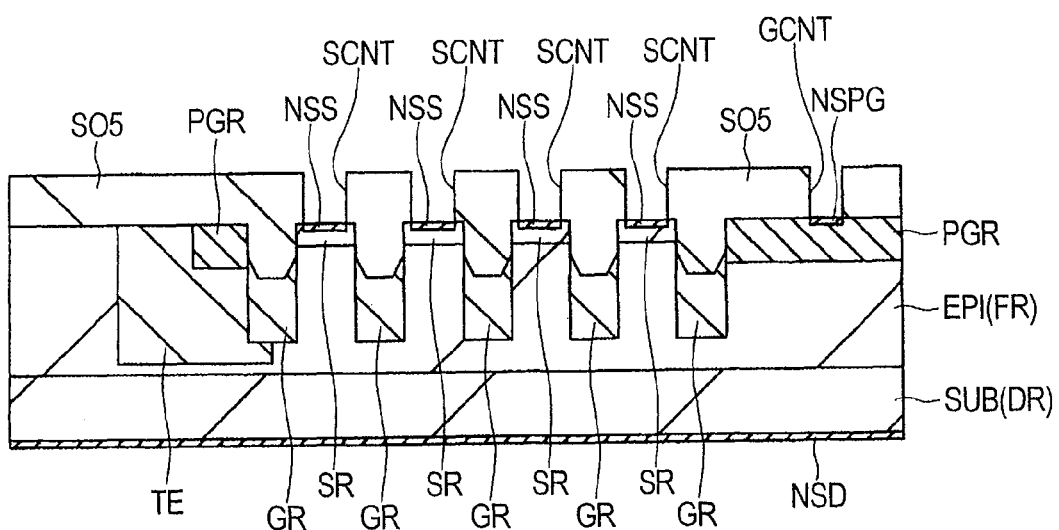
FIG. 14 is a fragmentary cross-sectional view showing a manufacturing step of the semiconductor device following that of FIG. 13.

Next, as shown in FIG. 14, first silicide annealing is conducted to react nickel (Ni) with silicon carbide (SiC) of the source region SR and a portion of the gate extraction region PGR to form nickel silicide (NiSi) films NSS and NSPG, respectively. Then, nickel (Ni) which has remained unreacted is removed. The first silicide annealing is conducted at a temperature of, for example, 700° C. and by this processing, the nickel silicide (NiSi) film NSS is formed selectively on the upper surface of the source region SR and the nickel silicide (NiSi) film NSPG is formed selectively on the portion of the upper surface of the gate extraction region PGR.

Further, second silicide annealing is conducted to decrease the resistance of the nickel silicide (NiSi) films NSS and NSPG. The second silicide annealing temperature is, for example, 1000° C.

Similarly, a nickel silicide (NiSi) film NSD is formed on the back surface of the substrate SUB by the above-mentioned silicidation process.

Next, a first layer metal film is formed on the upper surface of the silicon oxide film SO5 including the inside of the source contact hole SCNT and the gate contact hole GCNT. The first layer metal film is, for example, a stacked film obtained by successively depositing a titanium (Ti) film, a titanium nitride (TiN) film, and an aluminum (Al) film in order of mention. The thickness of the titanium (Ti) film and the titanium nitride (TiN) film is, for example, 20 nm and the thickness of the aluminum (Al) film is, for example, 3 μm.

Figure 15:
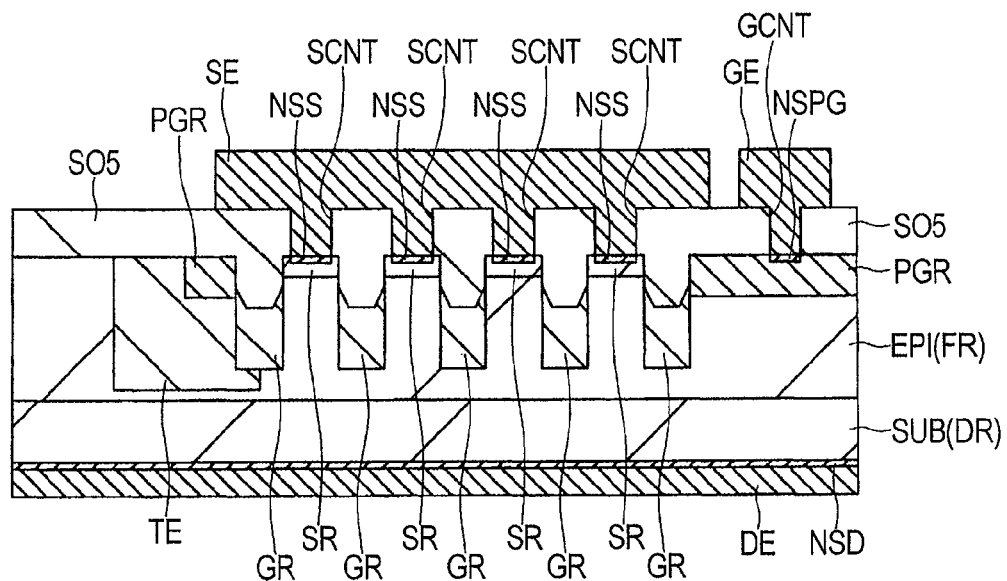
FIG. 15 is a fragmentary cross-sectional view showing a manufacturing step of the semiconductor device following that of FIG. 14.

Then, as shown in FIG. 15, by dry etching with a resist pattern (not illustrated) formed by lithography as a mask, the first layer metal film is processed into a source electrode SE to be electrically coupled to the source region SR through the nickel silicide (NiSi) film NSS and a gate electrode GE to be electrically coupled to the gate extraction region PGR through the nickel silicide (NiSi) film NSPG.

Next, after removal of the resist pattern, a drain electrode DE is formed on the back surface of the substrate SUB through the nickel silicide (NiSi) film NSD. The drain electrode DE is, for example, a stacked film obtained by successively depositing a titanium (Ti) film, a titanium nitride (TiN) film, and an aluminum (Al) film in order of mention.

Figure 16:
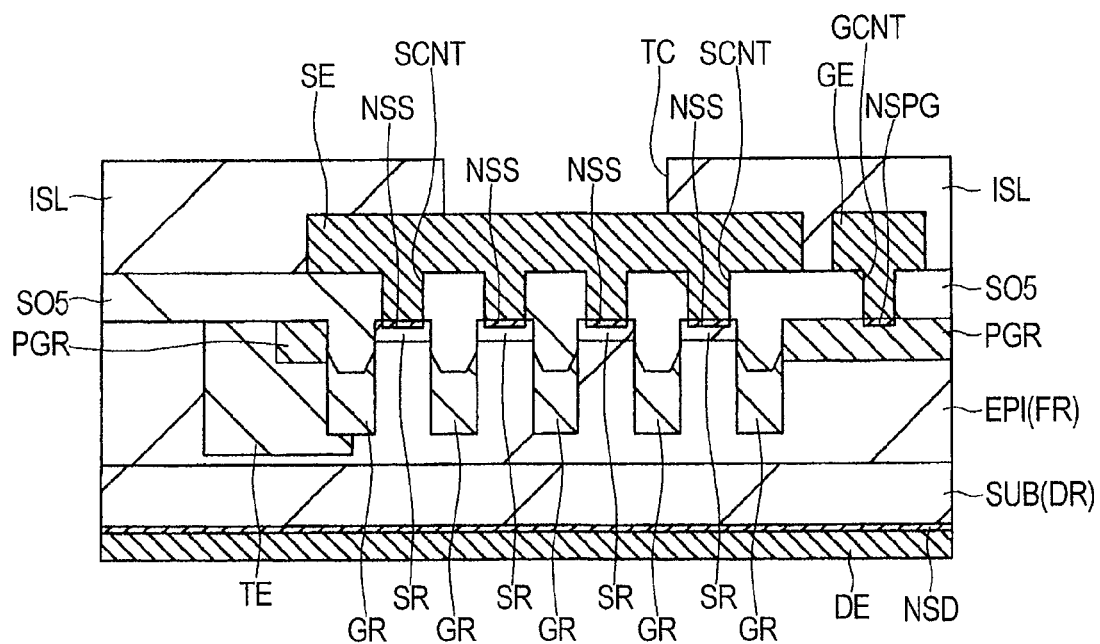
FIG. 16 is a fragmentary cross-sectional view showing a manufacturing step of the semiconductor device following that of FIG. 15.

Next, as shown in FIG. 16, an interlayer insulating film ISL is formed on the upper surface of the silicon oxide film SO5 so as to cover the source electrode SE and the gate electrode GE. The interlayer insulating film ISL is, for example, a TEOS film and it has a thickness of, for example, 1 μm. Then, by dry etching with a resist pattern (not illustrated) formed by lithography as a mask, the interlayer insulating film ISL is processed into through-holes TC (refer to the above-mentioned FIG. 2) from which a portion of the upper surface of the source electrode SE and a portion of the upper surface of the gate electrode GE are exposed, respectively.

Figure 17:
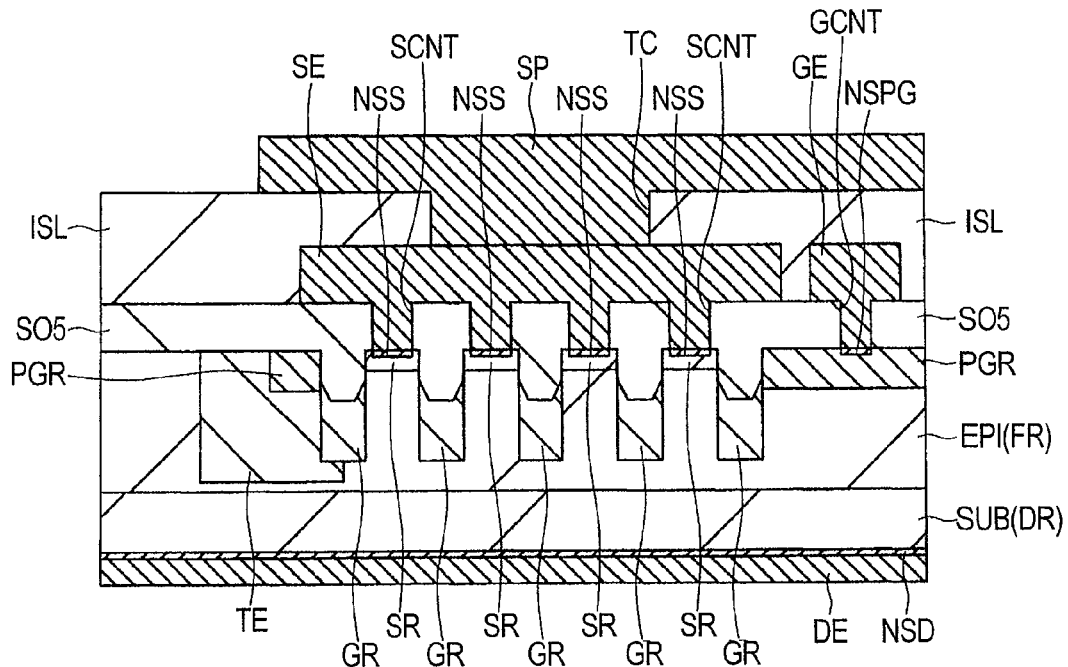
FIG. 17 is a fragmentary cross-sectional view showing a manufacturing step of the semiconductor device following that of FIG. 16.

Next, as shown in FIG. 17, after removal of the resist pattern, a second layer metal film is formed on the upper surface of the interlayer insulating film ISL including the inside of the through-hole TC. The second layer metal film is, for example, a stacked film obtained by successively depositing a titanium (Ti) film, a titanium nitride (TiN) film, and an aluminum (Al) film in order of mention. The titanium (Ti) film and the titanium nitride (TiN) film each have a thickness of, for example, 20 nm and the aluminum (Al) film has a thickness of, for example, 3 μm.

Then, by dry etching with a resist pattern (not illustrated) formed by lithography as a mask, the second layer metal film is processed into a source pad SP to be electrically coupled to the source electrode SE and a gate pad GP to be electrically coupled to the gate electrode GE (refer to the above-mentioned FIG. 2).

As described above, the semiconductor device having a vertical JFET according to First Embodiment can be manufactured.

In First Embodiment, the nickel silicide (NiSi) films NSS, NSPG, and NSD are formed on the upper surface of the source region SR, a portion of the upper surface of the gate extraction region PGR, and the back surface of the substrate SUB, respectively. The silicide film is not limited to them, but another one, for example, a titanium silicide (TiSi$_2$) film or a molybdenum silicide (MoSi$_2$) film may be formed instead.

Thus, according to First Embodiment, contact between the source region SR and the gate region GR can be avoided and the channel length can be increased so that the resulting vertical JFET has improved off-state performance. It is therefore possible to realize a semiconductor device having a vertical JFET excellent in off-state performance without reducing a production yield.

(Second Embodiment)

Second Embodiment is different from First Embodiment in that a vertical JFET according to Second Embodiment has a silicide layer on the upper surface of the gate region thereof. This means that the basic configuration of the semiconductor device having a vertical JFET according to Second Embodiment is the same as that of the above-mentioned semiconductor device having a vertical JFET according to First Embodiment except that the vertical JFET according to Second Embodiment has a silicide layer on the upper surface of the gate region thereof.

Figure 18:
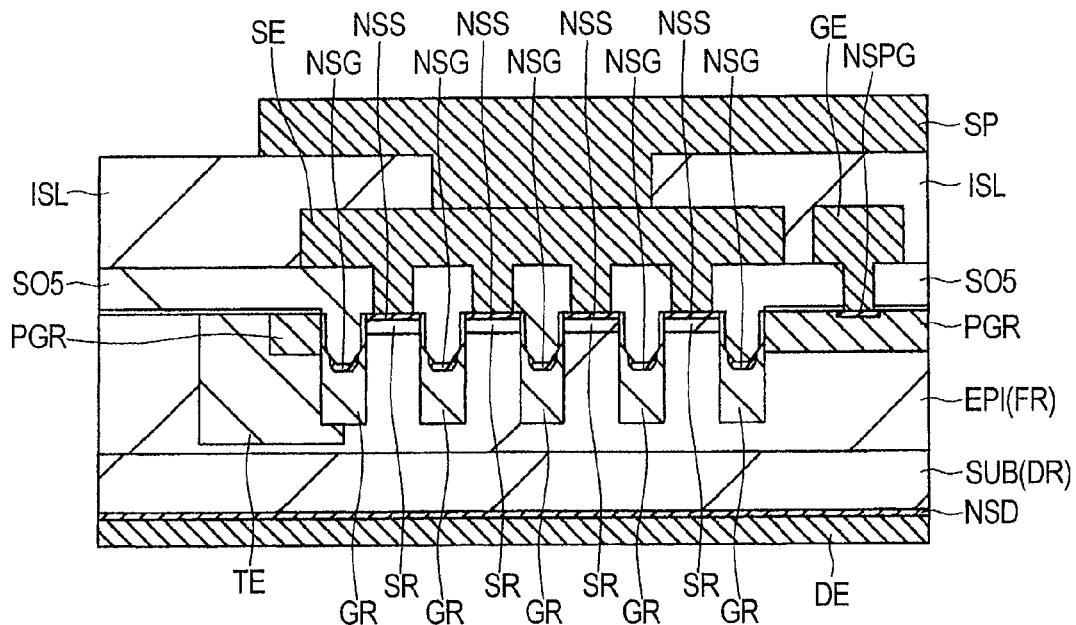
FIG. 18 is a fragmentary cross-sectional view showing one example of the configuration of a semiconductor device according to Second Embodiment.

First, the characteristic of the configuration of the vertical JFET according to Second Embodiment is described referring to FIG. 18. FIG. 18 is a fragmentary cross-sectional view showing one example of the configuration of the semiconductor device according to Second Embodiment.

An increase in the area ratio of the source region SR is necessary for obtaining a vertical JFET having high performance. The width of the gate region GR in a channel width direction should be reduced in order to increase the area ratio of the source region SR without increasing the size of a semiconductor device. A reduction in the width of the gate region GR however causes a problem, that is, an increase in resistance of a gate wiring.

One of methods for suppressing an increase in the resistance of a gate wiring is formation of a silicide layer on the upper surface of the gate region GR. Even formation of a silicide layer on the upper surface of the gate region GR is however not effective for reducing the resistance of a gate wiring when a contact area between the gate region GR and the silicide layer is small.

As shown in FIG. 18, therefore, a downward slope from the side surface of the gate region GR to the center thereof is provided on the upper surface of the gate region GR to make the area of the upper surface of the gate region GR larger than that of the upper surface of the gate region GR which is flat. A silicide layer is then formed on the upper surface. This makes it possible to reduce the resistance of a gate wiring because even if the width of the gate region GR in the channel width direction is small, the contact area between the gate region GR and the silicide layer increases.

Figure 5:
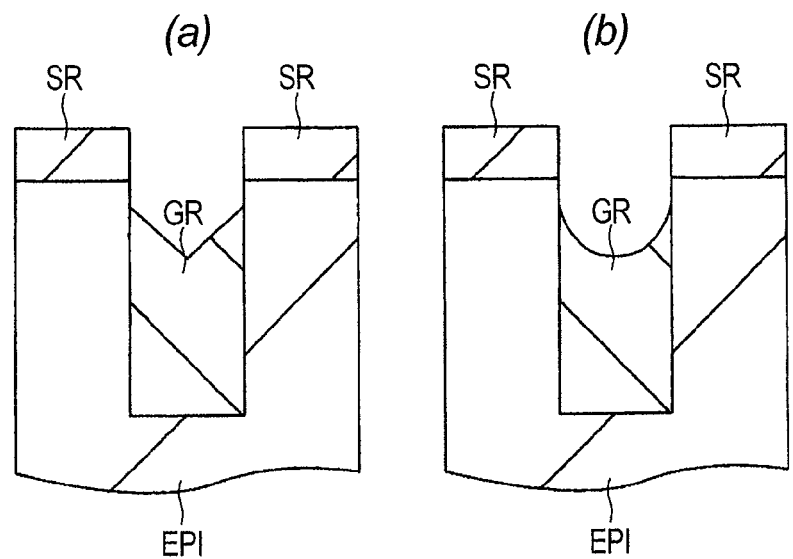
FIG. 5(a) is an enlarged cross-sectional view of a first modification example of the gate region in First Embodiment and FIG. 5(b) is an enlarged cross-sectional view of a second modification example of the gate region in First Embodiment.

FIG. 18 shows the gate region GR having, in the cross-section taken along the channel width direction, a flat portion and a sloped portion, but the shape of the gate region is not limited thereto. For example, as shown in FIG. 5(*a*) the upper surface of the gate region GR may be V-shaped in the cross-section taken along the channel width direction. Alternatively, as shown in FIG. 5(*b*) the upper surface of the gate region GR may be U-shaped in the cross-section taken along the channel width direction.

Next, a manufacturing method of the semiconductor device having a vertical JFET according to Second Embodiment will be described in order of steps. FIGS. 19 to 23 are fragmentary cross-sectional views of the semiconductor device according to Second Embodiment. Procedures until the formation of the gate extraction region PGR are similar to those of First Embodiment so that a description on them is omitted.

After the step of First Embodiment described referring to FIG. 12, the silicon oxide film SO4 is removed using wet etching. Then, a carbon (C) film is formed on the upper surface of the epitaxial layer EPI. Then, the n type impurity and the p type impurity implanted into the epitaxial layer EPI are activated, for example, by heat treatment at 1800° C. By this heat treatment with the carbon (C) film as a mask, outflow of silicon (Si) from the epitaxial layer EPI can be prevented.

Figure 19:
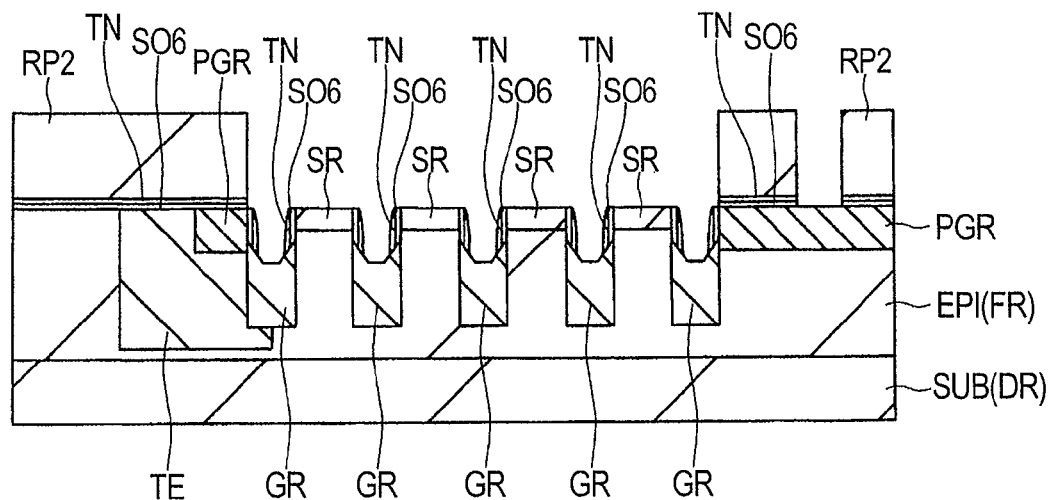
FIG. 19 is a fragmentary cross-sectional view showing a manufacturing step of the semiconductor device according to Second Embodiment.

Next, as shown in FIG. 19, after removal of the carbon (C) film by using plasma ashing, a silicon oxide film SO6 and a titanium nitride (TiN) film are successively formed on the upper surface of the epitaxial layer EPI. The silicon oxide film SO6 has a thickness of, for example, 10 nm and the thickness of the titanium nitride (TiN) film is, for example, 50 μm. Then, the titanium nitride (TiN) film TN is etched using dry etching to form a sidewall covering therewith the side surface of the source region SR and made of the titanium nitride (TiN) film TN.

Further, a resist pattern RP2 is formed using lithography. By dry etching with this resist pattern RP2 as a mask, the exposed silicon oxide film SO6 is removed, by which the sidewall of the source region SR is covered with the titanium nitride (TiN) film TN and the silicon oxide film SO6 and the upper surface of the source region SR, a portion of the upper surface of the gate extraction region PGR, and the upper surface of the gate region GR are exposed.

Figure 20:
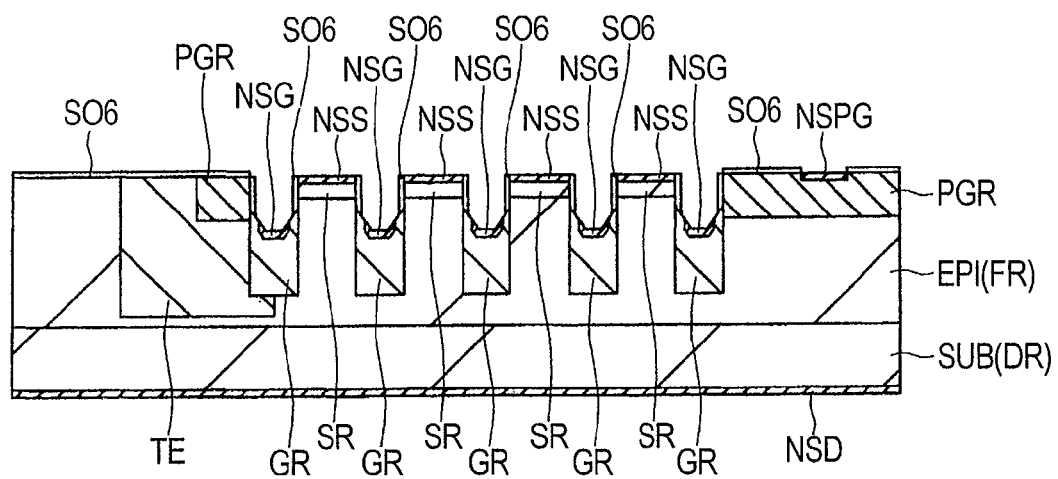
FIG. 20 is a fragmentary cross-sectional view showing a manufacturing step of the semiconductor device following that of FIG. 19.

Next, after removal of the resist pattern RP2, a nickel (Ni) film is formed on the upper surface of the epitaxial layer EPI by sputtering. Then, as illustrated in FIG. 20, first silicide annealing is conducted to allow the silicon carbide (SiC) of the source region SR, the portion of the gate extraction region, and the gate region GR to react with the nickel (Ni) to form nickel silicide (NiSi) films NSS, NSPG, and NSG. The nickel (Ni) which has remained unreacted is then removed. The first silicide annealing temperature is, for example, 700° C. By this annealing, the nickel silicide (NiSi) film NSS is formed selectively on the upper surface of the source region SR, while the nickel silicide (NiSi) film NSPG is formed selectively on the portion of the upper surface of the gate extraction region PGR. Further, the nickel silicide (NiSi) film NSG is formed selectively on the upper surface of the gate region GR.

Further, second silicide annealing is conducted to reduce the resistance of these nickel silicide (NiSi) films NSS, NSPG, and NSG. The second silicide annealing temperature is, for example, 1000° C. Then, the titanium nitride (TiN) film TN is removed by washing with SPM (sulfuric acid hydrogen peroxide mixture).

Similarly, a nickel silicide (NiSi) film NSD is formed on the back surface of the substrate SUB by the above-mentioned silicidation process.

Figure 21:
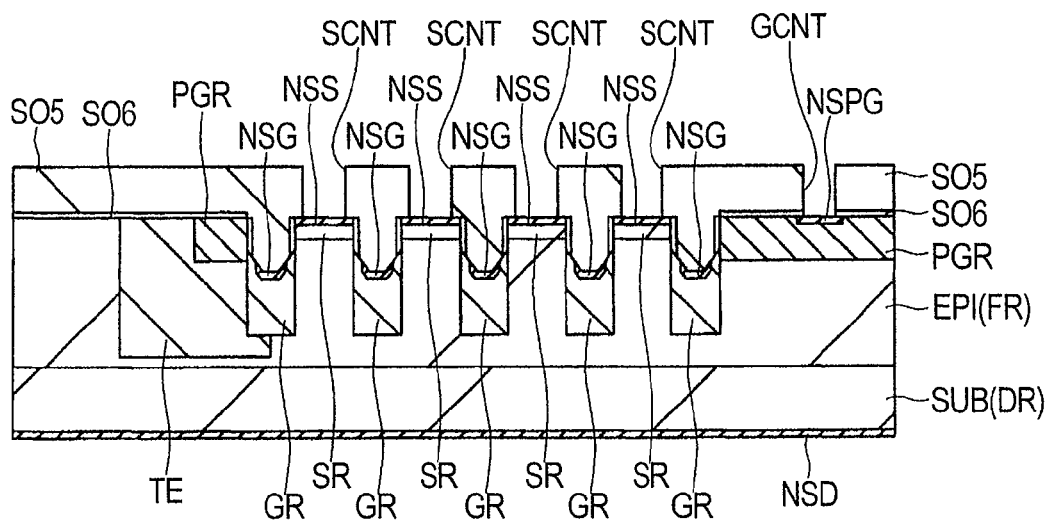
FIG. 21 is a fragmentary cross-sectional view showing a manufacturing step of the semiconductor device following that of FIG. 20.

Next, as shown in FIG. 21, a silicon oxide film SO5 is formed on the upper surface of the epitaxial layer EPI. The silicon oxide film SO5 is, for example, a TEOS film and it has a thickness of, for example, 1 μm. Then, by dry etching with a resist pattern (not illustrated) formed by lithography as a mask, the silicon oxide film SO5 is processed into a source contact hole SCNT from which the nickel silicide (NiSi) layer NSS (a portion with which a source electrode made of a first layer metal film is to be brought into contact) formed on the upper surface of the source region SR is exposed and a gate contact hole GCNT from which the nickel silicide (NiSi) layer NSPG (a portion with which a gate electrode made of the first layer metal film is to be brought into contact) formed on the upper surface of the gate extraction region PGR is exposed.

Figure 22:
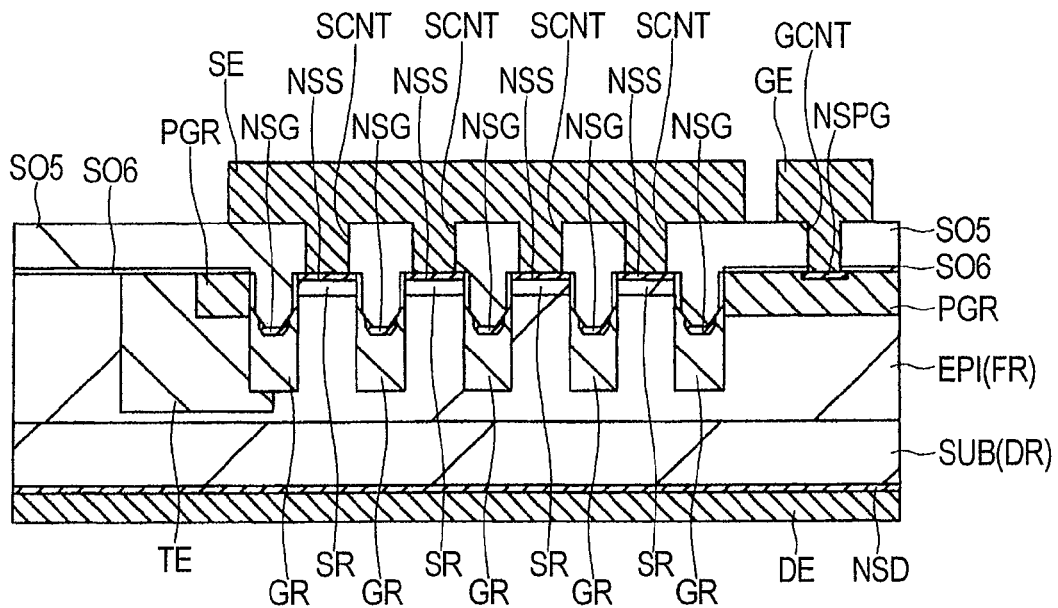
FIG. 22 is a fragmentary cross-sectional view showing a manufacturing step of the semiconductor device following that of FIG. 21.

Next, as shown in FIG. 22, after removal of the resist pattern, the first layer metal film is formed on the upper surface of the silicon oxide film SO5 including the inside of the source contact hole SCNT and the inside of the gate contact hole GCNT. The first layer metal film is a stacked film obtained by successively depositing a titanium (Ti) film, a titanium nitride (TiN) film, and an aluminum (Al) film in order of mention. The titanium (Ti) film and the titanium nitride (TiN) film each have a thickness of, for example, 20 nm and the aluminum (Al) film has a thickness of, for example, 3 μm.

Next, by dry etching with a resist pattern (not illustrated) formed by lithography as a mask, the first layer metal film is processed into a source electrode SE to be electrically coupled to the source region SR through the nickel silicide (NiSi) film NSS and a gate electrode to be electrically coupled to the gate extraction region PGR with the nickel silicide (NiSi) film NSPG therebetween.

Next, after removal of the resist pattern, a drain electrode DE is formed on the back surface of the substrate SUB with the nickel silicide (NiSi) film NSD therebetween. The drain electrode DE is a stacked film obtained by successively depositing a titanium (Ti) film, a titanium nitride (TiN) film, and an aluminum (Al) film in order of mention.

Figure 23:
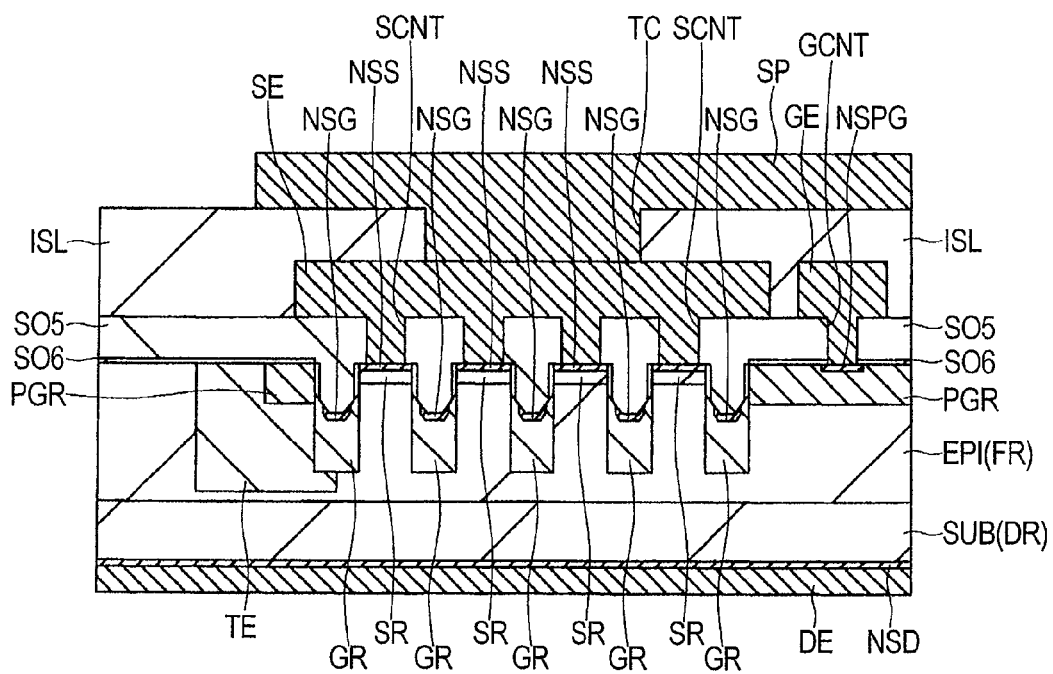
FIG. 23 is a fragmentary cross-sectional view showing a manufacturing step of the semiconductor device following that of FIG. 22.

Then, as shown in FIG. 23, similar to First Embodiment, an interlayer insulating film ISL and a source pad SP, a gate pad GP, and the like each made of a second layer metal film are formed to complete manufacture of the semiconductor device having a vertical JFET according to Second Embodiment.

In Second Embodiment, the nickel silicide (NiSi) films NSS, NSPG, NSG, and NSD are formed on the upper surface of the source region SR, the portion of the upper surface of the gate extraction region PGR, the upper surface of the gate region GR, and the back surface of the substrate SUB, respectively, but the silicide film is not limited to it. Another silicide film, for example, a titanium silicide ($TiSi_2$) film or a molybdenum silicide film ($MoSi_2$) may be formed.

According to Second Embodiment, a contact area between the upper surface of the gate region GR and the silicide layer increases so that the vertical JFET thus obtained has reduced gate wiring resistance. As a result, a semiconductor device having a vertical JFET having, in addition to the above-mentioned advantage of First Embodiment, enhanced performance can be obtained.

The invention made by the present inventors is described specifically based on some embodiments. It is however obvious that the invention is not limited to the above-mentioned embodiments but can be changed in various ways without departing from the scope of the invention.

What is claimed is:

1. A method of manufacturing a semiconductor device, comprising steps of:
   (a) providing a substrate of silicon carbide having a first conductivity type;
   (b) forming an epitaxial layer of the first conductivity type over a front surface of the substrate;
   (c) introducing an impurity of the first conductivity type into the epitaxial layer by a first ion implantation to form a source region having a first depth from an upper surface of the epitaxial layer;
   (d) introducing an impurity of a second conductivity type different from the first conductivity type into the epitaxial layer below the source region by a second ion implantation to form two or more individual gate regions separated from each other in a first direction, the individual gate regions having a respective upper surface, a respective lower surface, and respective side surfaces, wherein adjacent individual gate regions are separated by material of the epitaxial layer to form, between two adjacent individual gate regions, a respective channel formation region;
   (e) removing the source region located over the respective upper surfaces of the individual gate regions by a first etching;
   (f) after the step (e), processing the respective upper surfaces of the individual gate regions by a second etching having an etching rate lower at the respective side surfaces of the individual gate regions than at respective centers of the individual gate regions;
   (g) forming a source electrode to be electrically coupled to the source region;
   (h) forming a gate electrode to be electrically coupled to the gate regions; and
   (i) forming a drain electrode to be electrically coupled to a back surface of the substrate.

2. The method of manufacturing a semiconductor device according to claim 1,
   wherein in the step (e), the respective upper surfaces of the individual gate regions are parallel to the front surface of the substrate, and
   wherein after the step (f), the respective upper surfaces of the individual gate regions have, in a cross-section taken along the first direction, a downward slope from the respective side surfaces of the individual gate regions to the respective centers of the individual gate regions.

3. The method of manufacturing a semiconductor device according to claim 1,
   wherein in the step (d), the respective lower surfaces of the individual gate regions are parallel to the front surface of the substrate and the respective side surfaces of the individual gate regions are perpendicular to the front surface of the substrate.

4. The method of manufacturing a semiconductor device according to claim 1,
   wherein in the step (f), the respective upper surfaces of the individual gate regions have, in the cross-section taken along the first direction, at least one of: V-shapes, U-shapes, or shapes which, at the respective centers of the respective upper surfaces, are parallel to the front surface of the substrate and have opposing slopes from the respective centers to the side surfaces.

5. The method of manufacturing a semiconductor device according to claim 1,
   wherein the individual gate regions are formed by performing the second ion implantation a plurality of times and have uniform concentration distributions in a direction from the respective upper surfaces toward the respective lower surfaces at the respective side surfaces of the individual gate regions.

6. The method of manufacturing a semiconductor device according to claim 1, comprising, between the step (f) and the step (g), the steps of:
   (j) successively forming an insulating film and a titanium nitride film over the upper surface of the epitaxial layer;
   (k) etching the titanium nitride film to form sidewalls of the titanium nitride film over sidewalls of the source region;
   (l) removing the insulating film to expose the respective upper surfaces of the individual gate regions and upper surfaces of the source region;
   (m) forming silicide layers selectively over the respective upper surfaces of the individual gate regions and the upper surfaces of the source region; and
   (n) removing the sidewalls of the titanium nitride film.

7. The method of manufacturing a semiconductor device according to claim 6, wherein the silicide layers are nickel silicide.

8. A method of manufacturing a semiconductor device, the method comprising:
   providing a substrate of silicon carbide having a first conductivity type;
   forming an epitaxial layer of the first conductivity type over a front surface of the substrate;
   introducing an impurity of the first conductivity type into the epitaxial layer by a first ion implantation to form a source region having a first depth from an upper surface of the epitaxial layer;
   introducing an impurity of a second conductivity type different from the first conductivity type into the epitaxial layer below the source region by a second ion implantation to form two or more individual gate regions separated from each other in a first direction, the individual gate regions having a respective upper surface, a respective lower surface, and respective side surfaces, wherein adjacent individual gate regions are separated by material of the epitaxial layer;

removing the source region located over the respective upper surfaces of the individual gate regions by a first etching;

processing the respective upper surfaces of the individual gate regions by a second etching having an etching rate lower at the respective side surfaces of the individual gate regions than at respective centers of the individual gate regions;

forming a source electrode to be electrically coupled to the source region;

forming a gate electrode to be electrically coupled to the gate regions; and forming a drain electrode to be electrically coupled to the substrate.

9. The method of manufacturing a semiconductor device according to claim 8, further comprising:

forming the respective upper surfaces of the individual gate regions parallel to the front surface of the substrate, wherein, following the second etching, the respective upper surfaces of the individual gate regions have, in a cross-section taken along the first direction, a downward slope from the respective side surfaces of the individual gate regions to the respective centers of the individual gate regions.

10. The method of manufacturing a semiconductor device according to claim 8, further comprising:

forming the respective lower surfaces of the individual gate regions parallel to the front surface of the substrate and the respective side surfaces of the individual gate regions perpendicular to the front surface of the substrate.

11. The method of manufacturing a semiconductor device according to claim 8, further comprising:

performing the second etching so that the respective upper surfaces of the individual gate regions have, in the cross-section taken along the first direction, at least one of: V-shapes, U-shapes, or shapes which, at the respective centers of the respective upper surfaces, are parallel to the front surface of the substrate and have opposing slopes from the respective centers to the side surfaces.

12. The method of manufacturing a semiconductor device according to claim 8, further comprising:

forming the individual gate regions by performing the second ion implantation a plurality of times, wherein the individual gate regions have uniform concentration distributions in a direction from the respective upper surfaces toward the respective lower surfaces at the respective side surfaces of the individual gate regions.

13. The method of manufacturing a semiconductor device according to claim 8, further comprising, subsequent to the second etching:

successively forming an insulating film and a titanium nitride film over the upper surface of the epitaxial layer;

etching the titanium nitride film to form sidewalls of the titanium nitride film over sidewalls of the source region;

removing the insulating film to expose the respective upper surfaces of the individual gate regions and upper surfaces of the source region;

forming silicide layers selectively over the respective upper surfaces of the individual gate regions and the upper surfaces of the source region; and removing the sidewalls of the titanium nitride film.

14. The method of manufacturing a semiconductor device according to claim 8, further comprising:

forming the two or more individual gate regions separated from each other in the first direction so that two adjacent individual gate regions are separated by the material of the epitaxial layer to define a channel width of a respective channel formation region between the two adjacent individual gate regions.

15. A method of manufacturing a semiconductor device, the method comprising:

forming an epitaxial layer of the first conductivity type over a front surface of a substrate having a first conductivity type;

introducing an impurity of the first conductivity type into the epitaxial layer by a first ion implantation to form a source region having a first depth from an upper surface of the epitaxial layer;

introducing an impurity of a second conductivity type different from the first conductivity type into the epitaxial layer below the source region by a second ion implantation to form two or more individual gate regions separated from each other in a first direction, the individual gate regions having a respective upper surface, a respective lower surface, and respective side surfaces, wherein adjacent individual gate regions are separated by material of the epitaxial layer;

removing the source region located over the respective upper surfaces of the individual gate regions by a first etching;

processing the respective upper surfaces of the individual gate regions by a second etching having an etching rate lower at the respective side surfaces of the individual gate regions than at respective centers of the individual gate regions;

forming a source electrode to be electrically coupled to the source region;

forming a gate electrode to be electrically coupled to the gate regions; and forming a drain electrode to be electrically coupled to the substrate.

16. The method of manufacturing a semiconductor device according to claim 15, further comprising:

forming the respective upper surfaces of the individual gate regions parallel to the front surface of the substrate, wherein, following the second etching, the respective upper surfaces of the individual gate regions have, in a cross-section taken along the first direction, a downward slope from the respective side surfaces of the individual gate regions to the respective centers of the individual gate regions.

17. The method of manufacturing a semiconductor device according to claim 15, further comprising:

forming the respective lower surfaces of the individual gate regions parallel to the front surface of the substrate and the respective side surfaces of the individual gate regions perpendicular to the front surface of the substrate.

18. The method of manufacturing a semiconductor device according to claim 15, further comprising:

performing the second etching so that the respective upper surfaces of the individual gate regions have, in the cross-section taken along the first direction, at least one of: V-shapes, U-shapes, or shapes which, at the respective centers of the respective upper surfaces, are parallel to the front surface of the substrate and have opposing slopes from the respective centers to the side surfaces.

19. The method of manufacturing a semiconductor device according to claim 15, further comprising:

forming the individual gate regions by performing the second ion implantation a plurality of times, wherein the individual gate regions have uniform concentration distributions in a direction from the respective upper surfaces toward the respective lower surfaces at the respective side surfaces of the individual gate regions.

20. The method of manufacturing a semiconductor device according to claim 15, further comprising:

forming the two or more individual gate regions separated from each other in the first direction so that two adjacent individual gate regions are separated by the material of the epitaxial layer to define a channel width of a respective channel formation region between the two adjacent individual gate regions.

\* \* \* \* \*